(12) United States Patent
Watanabe et al.

(10) Patent No.: US 11,427,911 B2
(45) Date of Patent: Aug. 30, 2022

(54) VALVE DEVICE, FLUID CONTROL DEVICE AND SEMICONDUCTOR MANUFACTURING APPARATUS USING THE VALVE DEVICE

(71) Applicant: FUJIKIN INCORPORATED, Osaka (JP)

(72) Inventors: Kazunari Watanabe, Osaka (JP); Kohei Shigyou, Osaka (JP); Kenji Aikawa, Osaka (JP); Tomohiro Nakata, Osaka (JP); Takahiro Matsuda, Osaka (JP); Tsutomu Shinohara, Osaka (JP)

(73) Assignee: FUJIKIN INCORPORATED, Osaka (JP)

(*) Notice: Subject to any disclaimer, the term of this patent is extended or adjusted under 35 U.S.C. 154(b) by 0 days.

(21) Appl. No.: 16/764,473

(22) PCT Filed: Nov. 12, 2018

(86) PCT No.: PCT/JP2018/041779
§ 371 (c)(1),
(2) Date: May 15, 2020

(87) PCT Pub. No.: WO2019/107123
PCT Pub. Date: Jun. 6, 2019

(65) Prior Publication Data
US 2020/0354835 A1 Nov. 12, 2020

(30) Foreign Application Priority Data
Nov. 30, 2017 (JP) .............................. JP2017-230186

(51) Int. Cl.
*F16K 1/52* (2006.01)
*F16K 7/17* (2006.01)
(Continued)

(52) U.S. Cl.
CPC .. *C23C 16/45561* (2013.01); *C23C 16/45544* (2013.01); *C23C 16/45587* (2013.01);
(Continued)

(58) Field of Classification Search
CPC .......... F16K 27/0263; F16K 7/17; F16K 7/14; F16K 1/42; C23C 16/45561; C23C 16/45587; C23C 16/45544
(Continued)

(56) References Cited

U.S. PATENT DOCUMENTS 10,648,572 B2 * 5/2020 Sawada et al. ....... G01F 15/003
2017/0212531 A1 7/2017 Nagase et al.

FOREIGN PATENT DOCUMENTS

JP     3-33566     2/1991
JP     9-250643     9/1997
(Continued)

OTHER PUBLICATIONS

International Search Report issued in International Patent Application No. PCT/JP2018/041779, dated Feb. 5, 2019.
(Continued)

*Primary Examiner* — Kevin L Lee
(74) *Attorney, Agent, or Firm* — Greenblum & Bernstein, P.L.C.

(57) ABSTRACT

A valve device with a built-in orifice is manufacturable with low-cost. The valve body defines an accommodation recess which opens at the surface of the valve body and contains a valve element therein, a primary flow path and a secondary flow path connected to the accommodation recess, the valve element having a sealing portion for blocking direct communication between the primary flow path and the secondary flow path through the accommodation recess, and a through flow passage for making the primary flow path and the secondary flow path communicate through the valve
(Continued)

element, wherein an orifice is formed in the through flow passage.

5 Claims, 11 Drawing Sheets

(51) Int. Cl.
    *C23C 16/455* (2006.01)
    *F16K 1/42* (2006.01)
    *F16K 27/02* (2006.01)

(52) U.S. Cl.
    CPC .................. *F16K 1/42* (2013.01); *F16K 1/52* (2013.01); *F16K 7/17* (2013.01); *F16K 27/0263* (2013.01); *F16K 27/0281* (2013.01)

(58) Field of Classification Search
    USPC ........................................................ 251/331
    See application file for complete search history.

(56) References Cited

FOREIGN PATENT DOCUMENTS

| | | |
|---|---|---|
| JP | 2000-213667 | 8/2000 |
| JP | 2007-003013 | 1/2007 |
| JP | 2016-024708 | 2/2016 |

OTHER PUBLICATIONS

Written Opinion of the International Searching Authority issued in International Application No. PCT/JP2018/041779, dated Feb. 5, 2019.
International Preliminary Report on Patentability issued in International Patent Application No. PCT/JP2018/041779, dated Jun. 2, 2020.
Korean Office Action, Korean Patent Office, Application No. 10-2020-7013647, dated Sep. 24, 2021 (with English translation).

\* cited by examiner

[fig.1A]
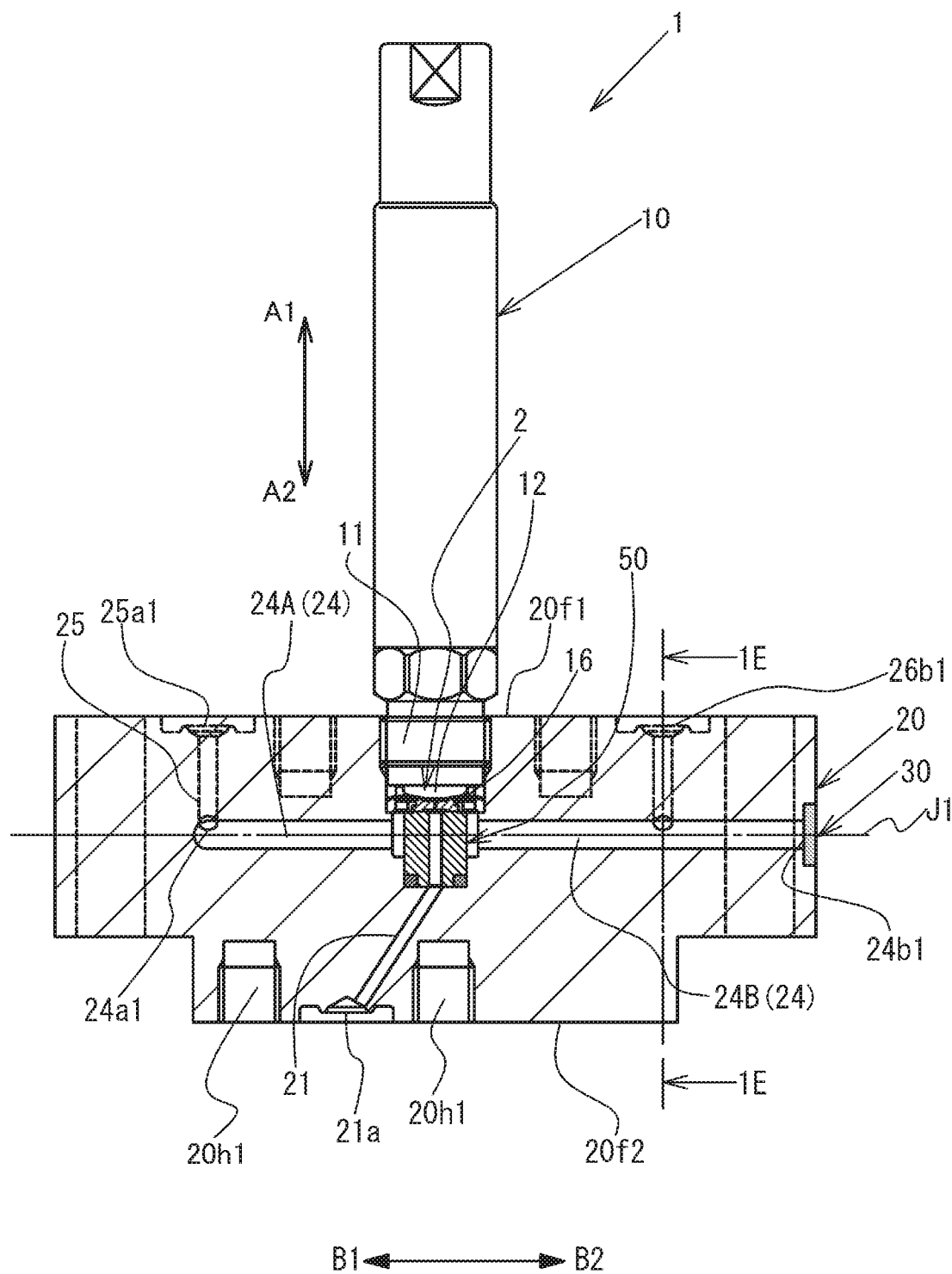

[fig.1B]
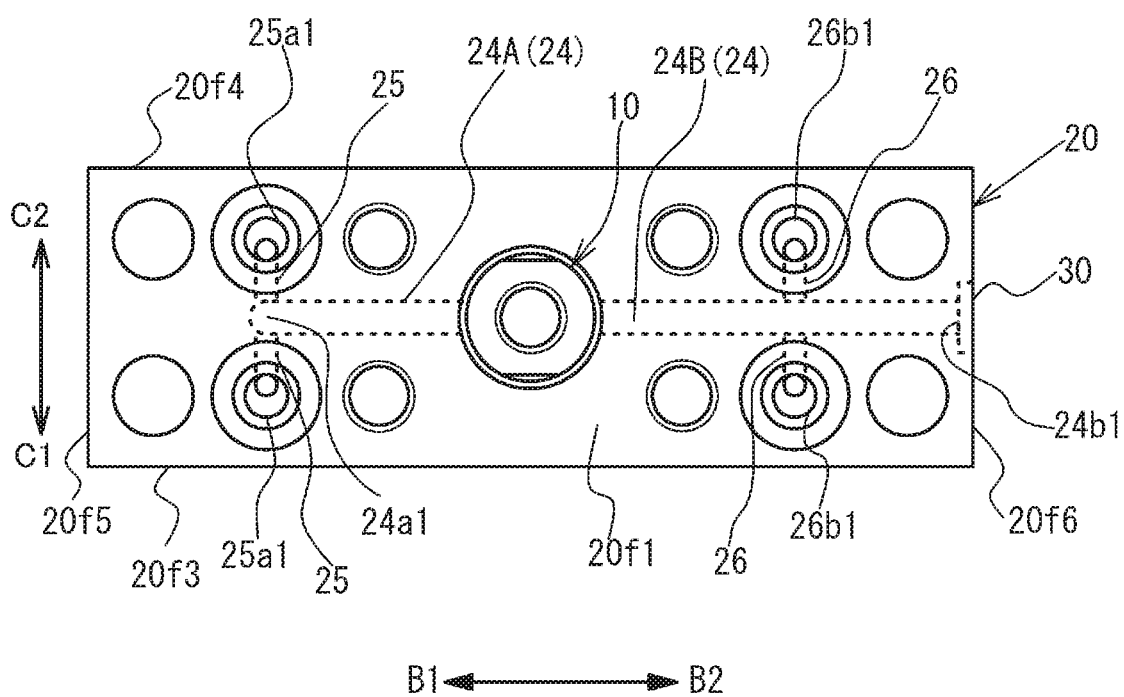

[fig.1C]
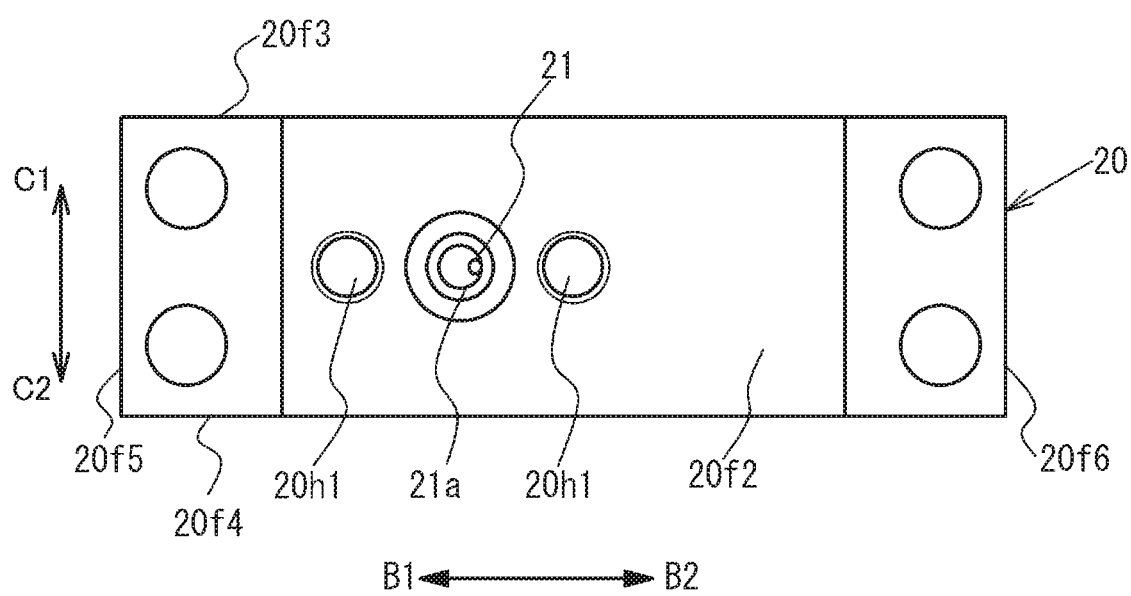

[fig.1D]
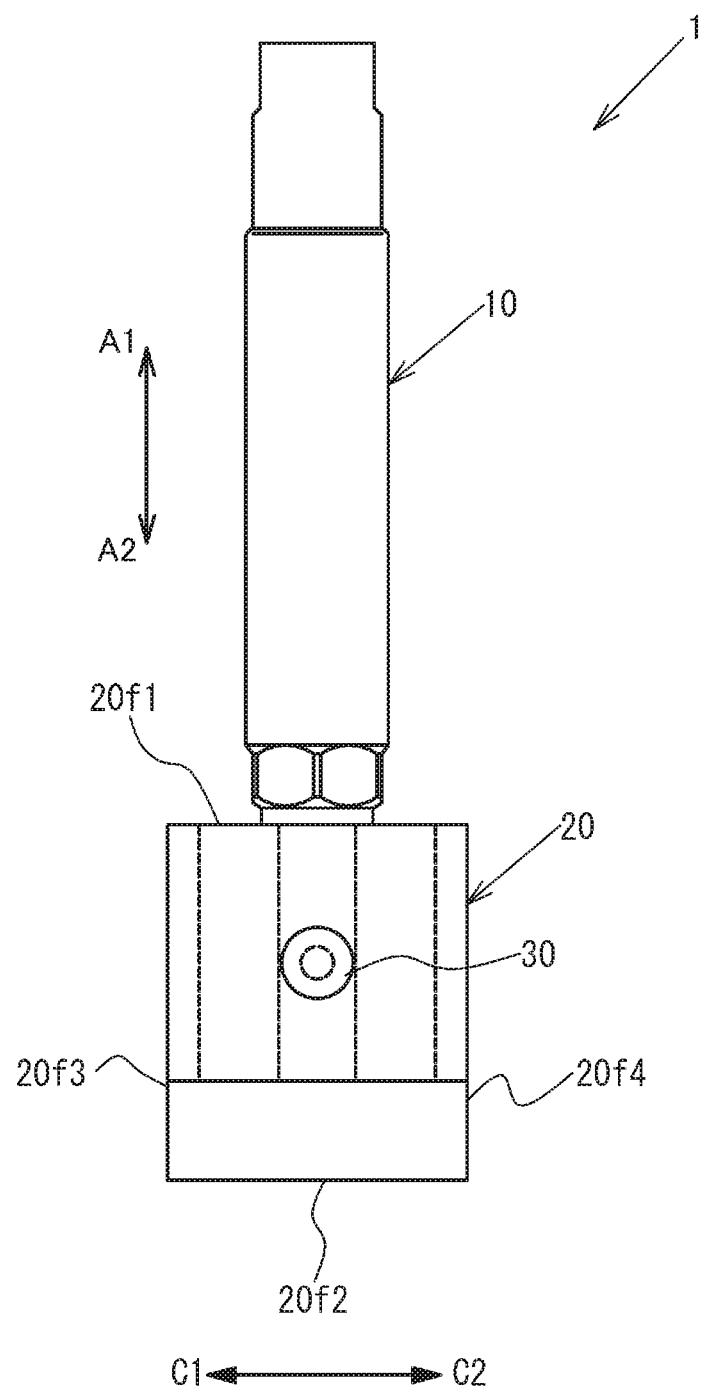

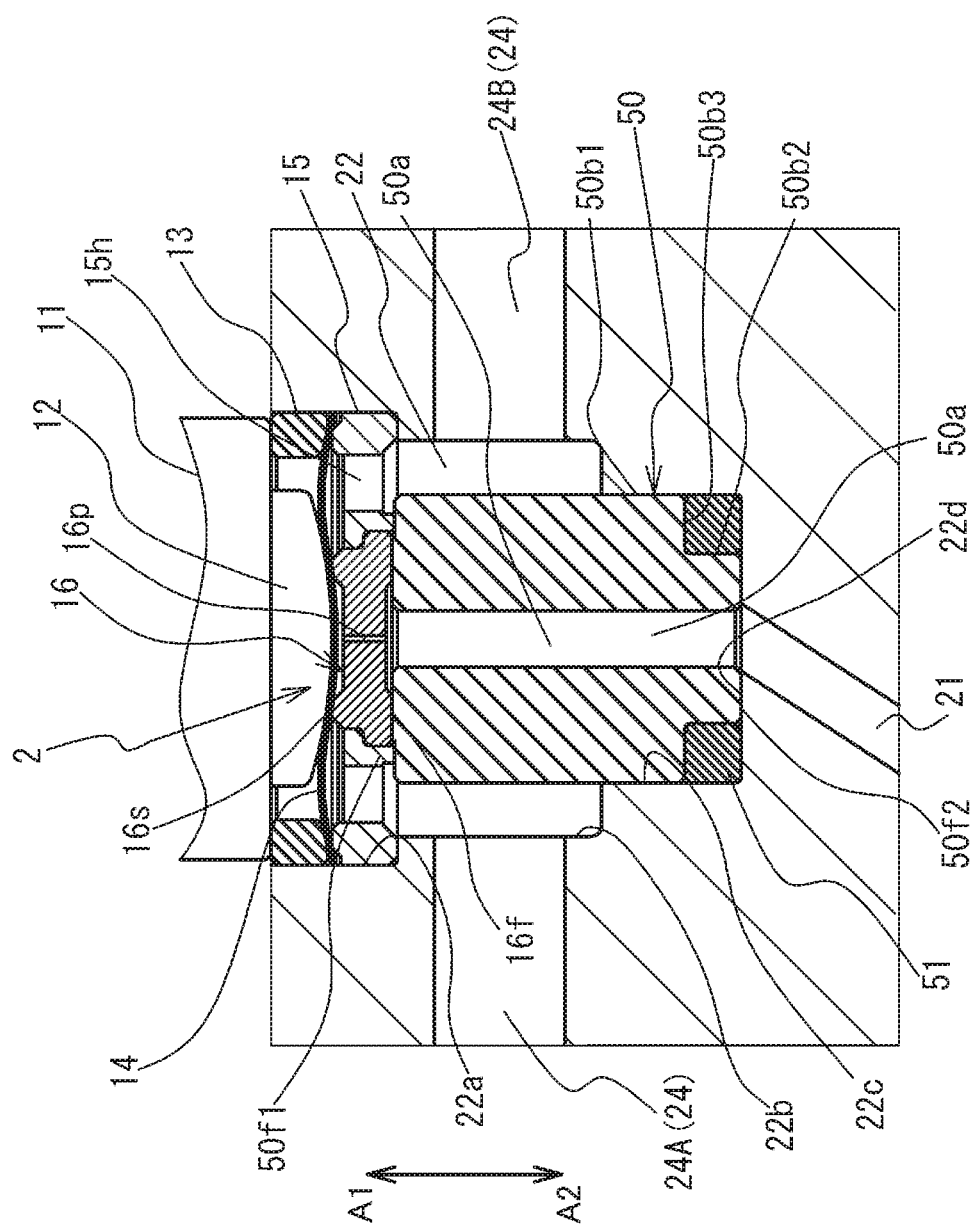
[fig.2]

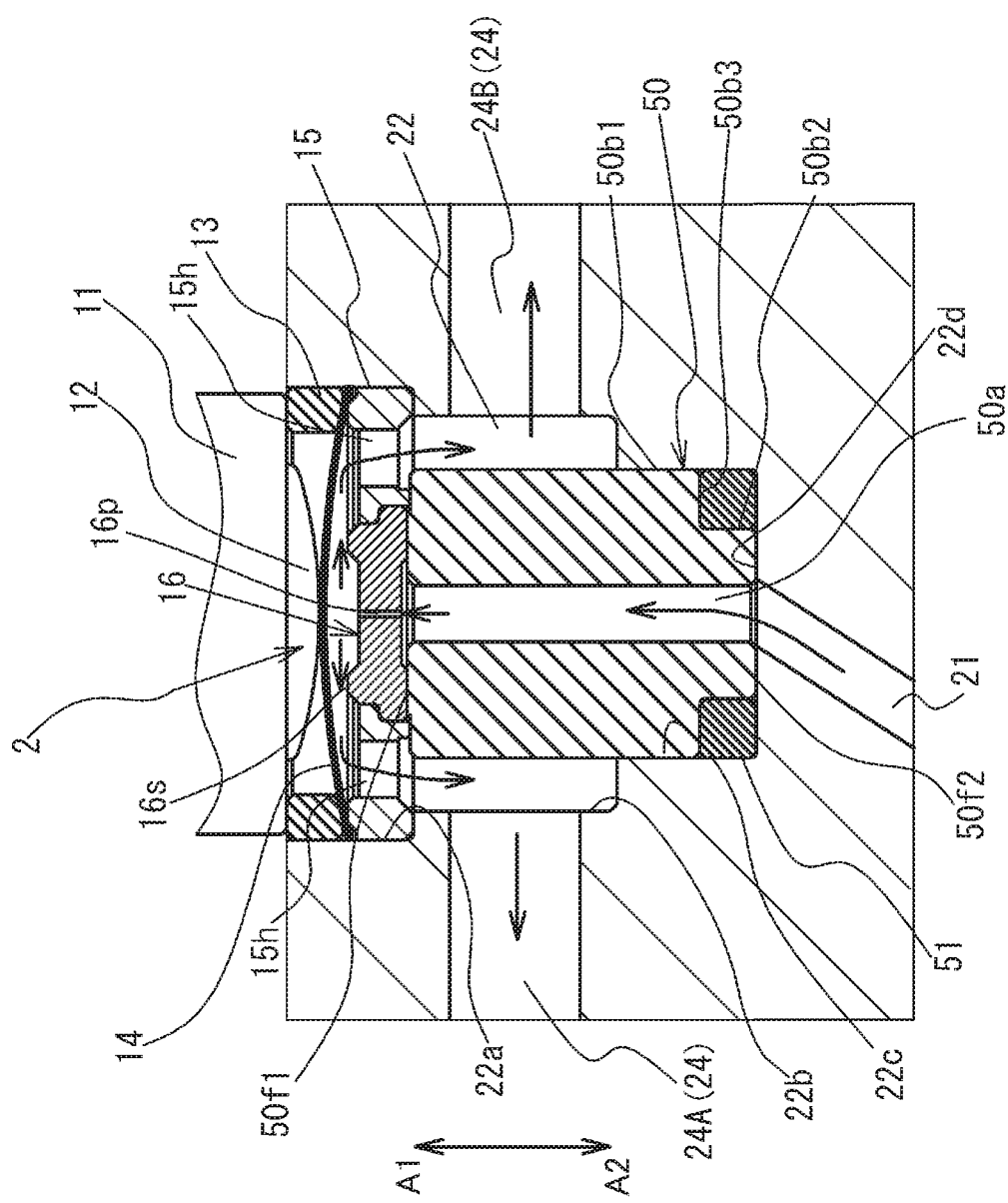
[fig.3]

[fig.4]
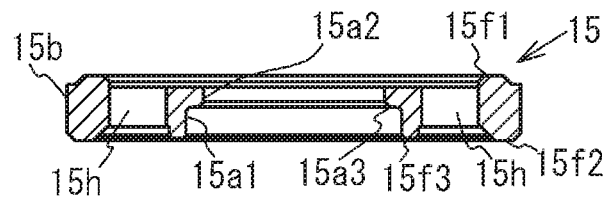
[fig.5]
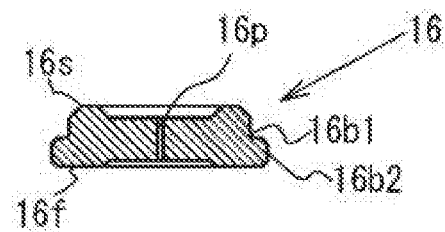
[fig.6]
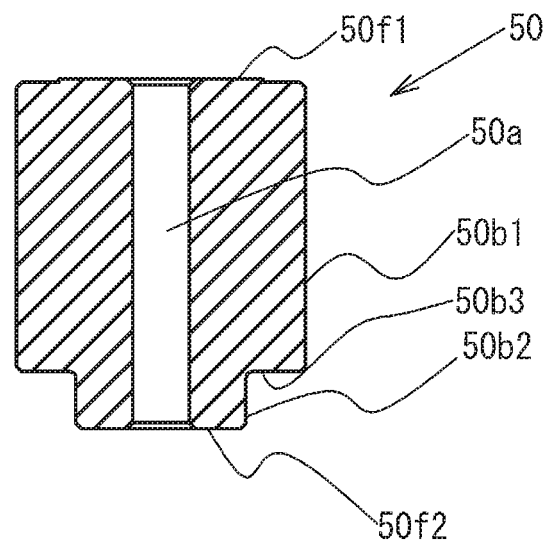

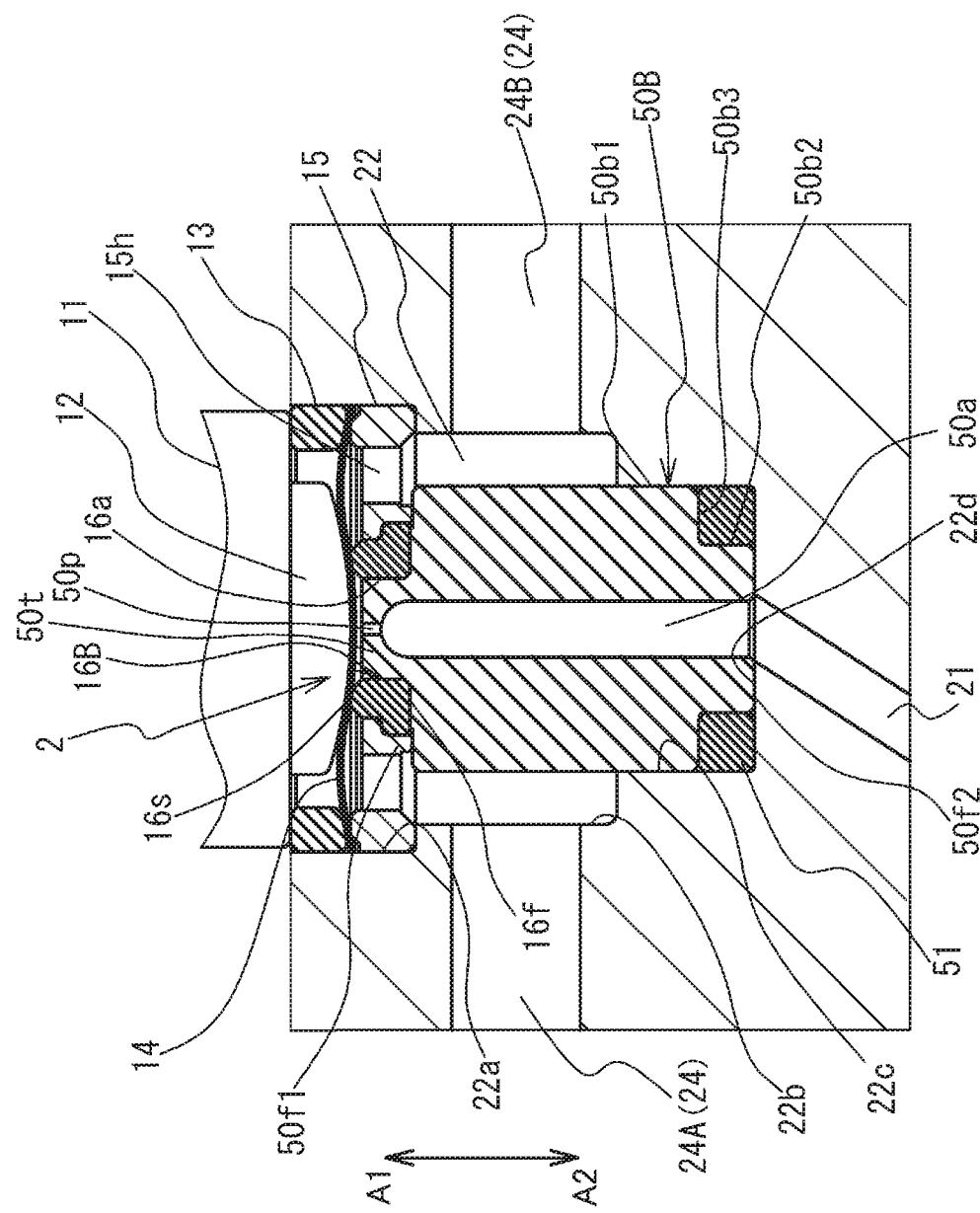
[fig.7]

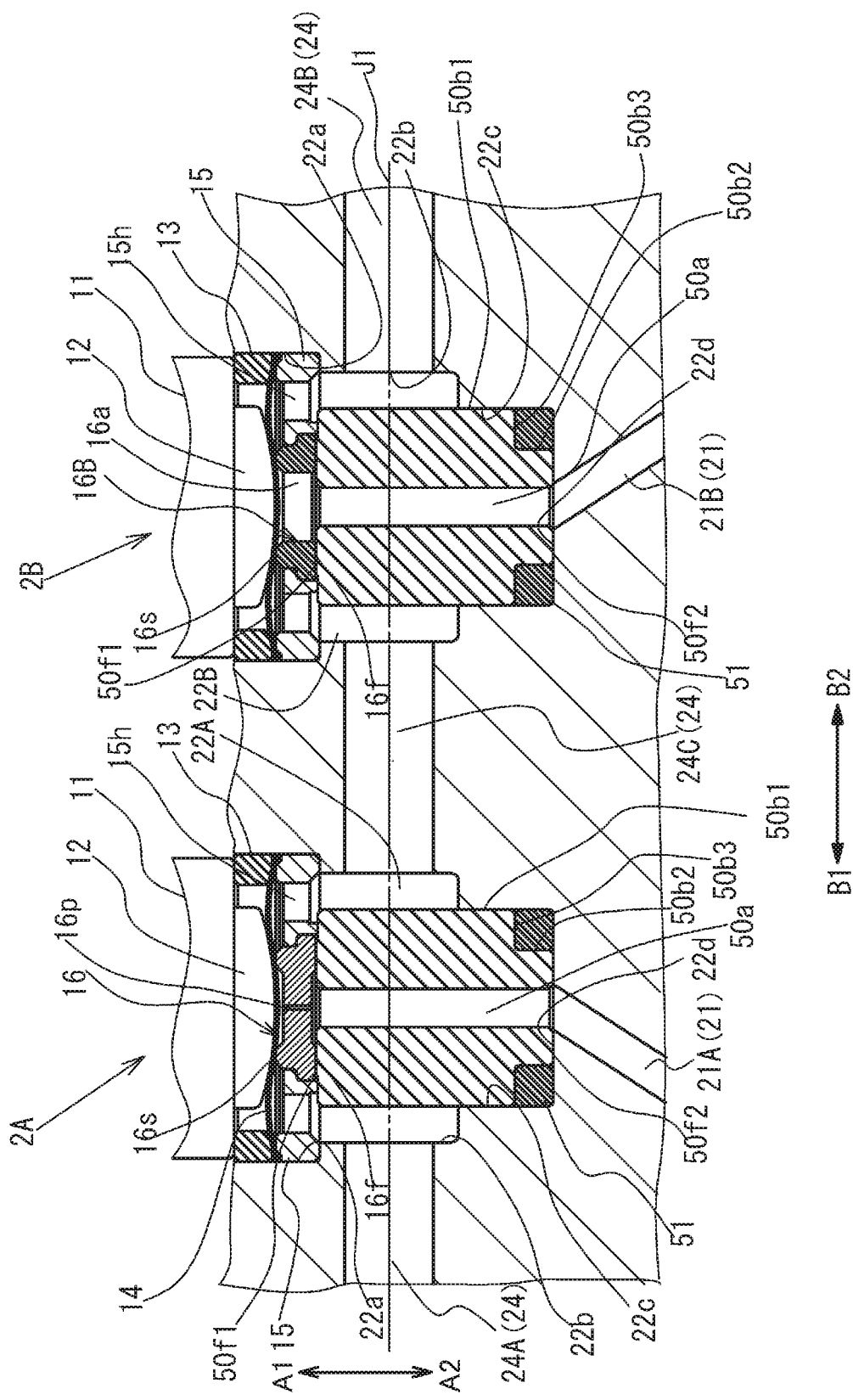
[fig.8]

[fig.9]
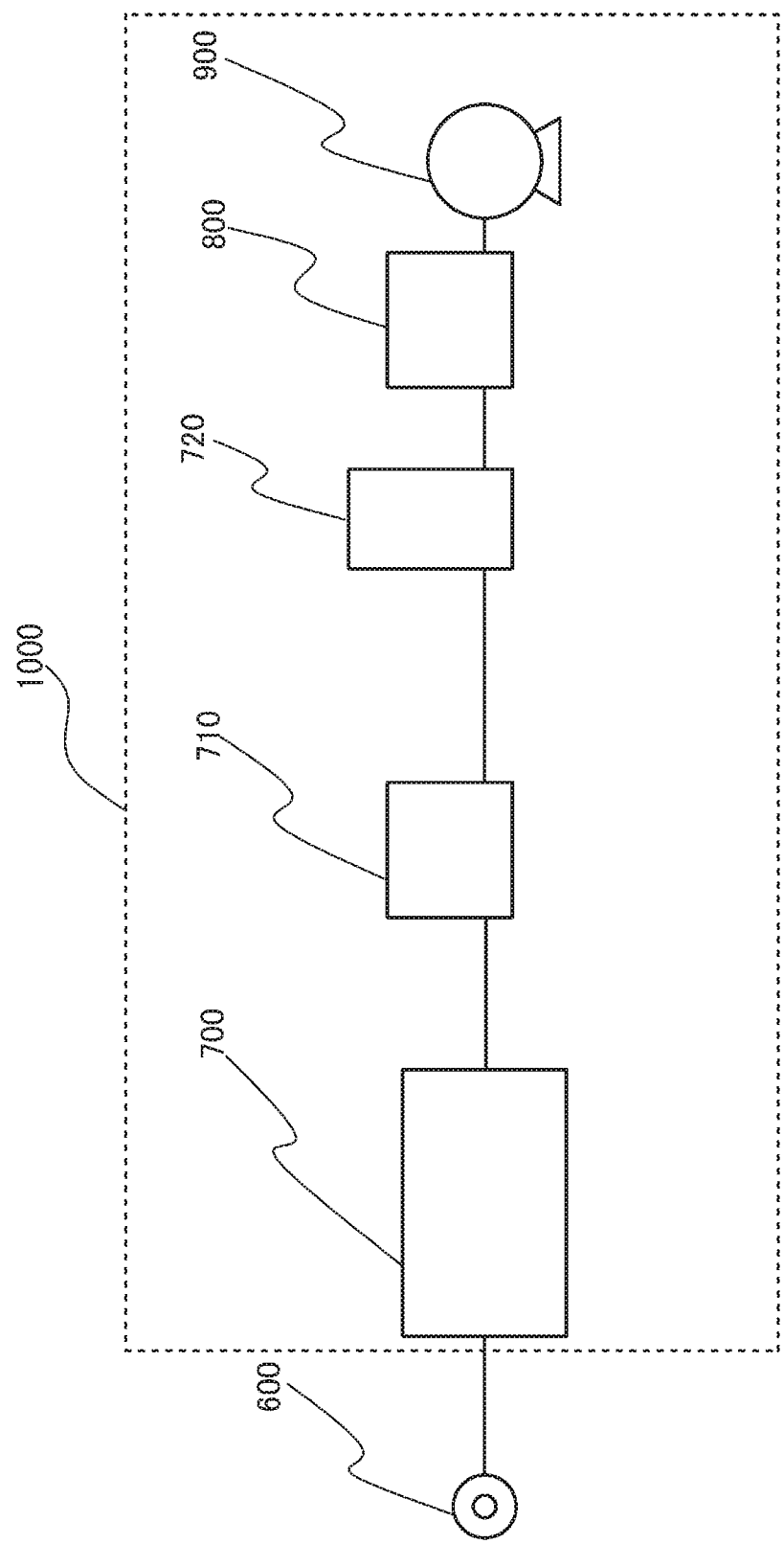

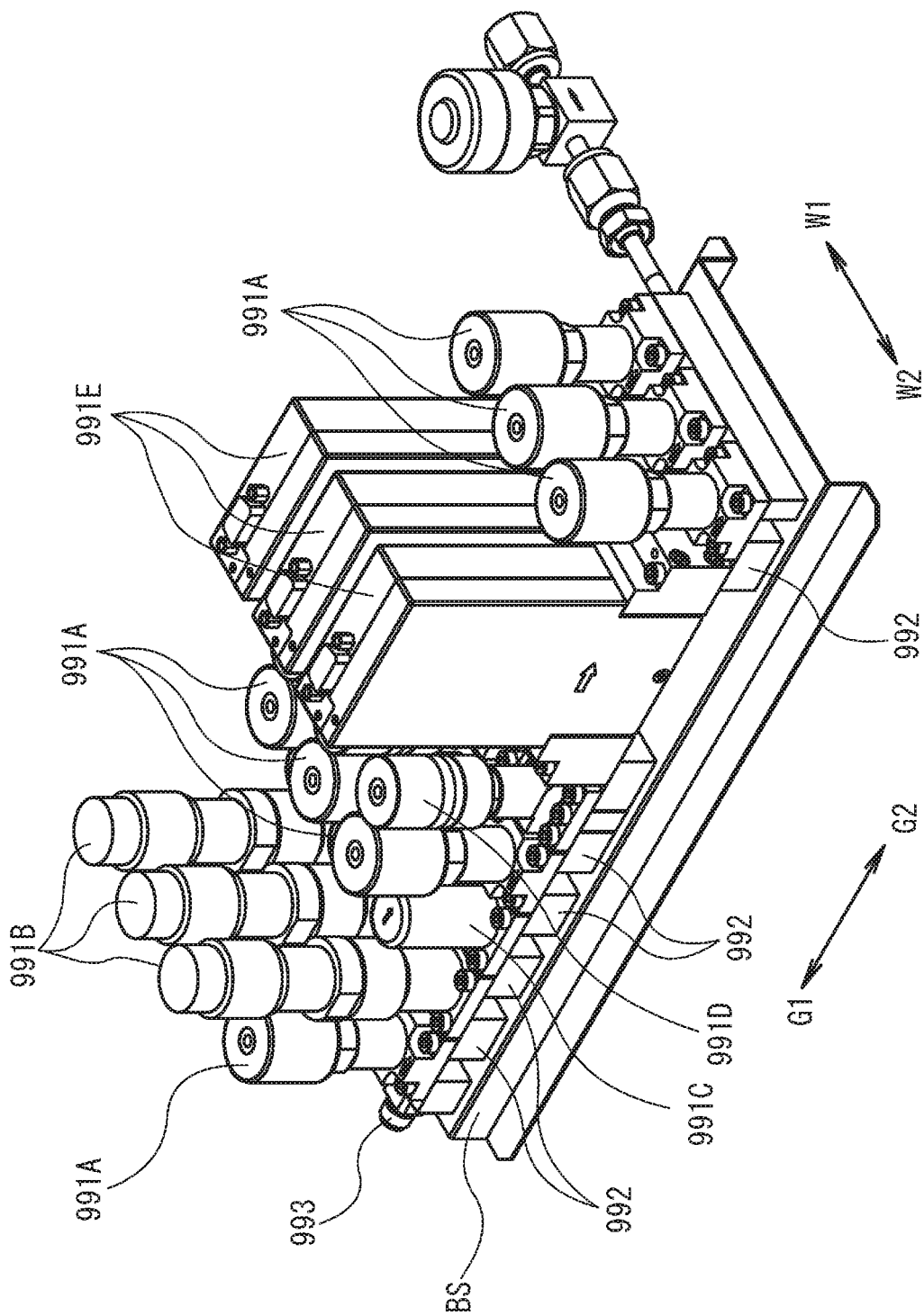

VALVE DEVICE, FLUID CONTROL DEVICE AND SEMICONDUCTOR MANUFACTURING APPARATUS USING THE VALVE DEVICE

TECHNICAL FIELD

The present invention relates to a valve device.

BACKGROUND ART

In various manufacturing processes such as semiconductor manufacturing processes, in order to supply accurately metered process gases to a processing chamber, a fluid control device integrated with various fluidic devices such as open-close valves, regulators, and mass flow controllers is used.

In such a fluid control device as described above, integration is realized by arranging an installation block (hereinafter referred to as a base block) in which a flow path is formed along the longitudinal direction of the base plate instead of a pipe joint, and installing a plurality of fluid devices including a joint block to which pipe joints and various fluid devices are connected, and the like on the base block (for example, refer to Patent Document 1).

PATENT LITERATURE

PTL 1: Japanese Laid-Open Patent Application No. 2007-3013

SUMMARY OF INVENTION

Technical Problem

To valve devices applied to fluid control device as described above, various functions are increasingly required. For example, orifices are provided in flow path of valve device.

However, if an orifice plate or the like is inserted into the flow path of a valve device, there occur problems that sealing is difficult and manufacturing costs becomes high.

It is an object to provide a valve device incorporating an orifice and which can be manufactured at low costs.

Solution to Problem

A valve device according to a first aspect of the present invention is a valve device comprising a block-shaped valve body, the valve body defining an accommodation recess opening at a surface of the valve body and containing a valve element, a primary flow path connected to a bottom surface of the accommodation recess, and a secondary flow path connected to an inner peripheral surface of the accommodation recess, the valve element having a sealing portion for blocking direct communication between the primary flow path and the secondary flow path through the accommodation recess, and a through flow passage for making the primary flow path and the secondary flow path communicate through the valve element, wherein an orifice is formed in the through flow passage.

Preferably, a configuration can be employed in which the valve element comprises:

a valve seat having an annular seating surface formed on one end surface, annular sealing surface formed on the other end surface, and a flow passage formed on an inner side of the seating surface and the sealing surface and penetrating from said one end surface to the other end surface;

a valve seat support having a support surface for contacting the sealing surface of the valve seat and supporting a pressing force from the sealing surface; and a diaphragm provided so as to abut to and separate from the seating surface supported by the valve seat support;

the diaphragm making the flow passage and the secondary flow path communicate through a gap between the diaphragm and the seating surface, the valve seat support having a sealing surface for cooperating with a part of an inner wall surface of the accommodation recess to block communication between the primary flow path and the secondary flow path, and a detour passage for connecting the primary flow path and the flow passage, wherein an orifice is formed in the flow passage of the valve seat or in the detour passage of the valve seat support.

A valve device according to a second aspect of the present invention is a valve device comprising a block-shaped valve body, the valve body defining first and second accommodation recesses respectively containing first and second valve elements, a primary flow path for making each of the first and second accommodation recesses communicate to an outside of the valve body, a secondary flow path for making each of the first and second accommodation recesses communicate to an outside of the valve body, and a communication flow path for connecting the first and second accommodation recesses to make the secondary flow paths communicate with each other, each of the first and second valve elements having a sealing portion for blocking direct communication between the primary flow path and the secondary flow path through the accommodation recess, and a through flow passage for making the primary flow path and the secondary flow path communicate through the valve element, wherein an orifice is formed in the through flow passage of one of the first and second valve elements.

The flow control method of the present invention comprises using a fluid control device including a valve device having the above configuration for flow control of a process gas.

The product manufacturing method of the present invention comprises using a fluid control device including a valve device having the above configuration for controlling a process gas in a manufacturing process of a product such as a semiconductor device, a flat panel display, or a solar panel, which requires a process step using the process gas in a sealed processing chamber.

The semiconductor manufacturing apparatus of the present invention comprises a fluid control device for supplying a process gas to a processing chamber, the fluid control device including a valve device having the above configuration.

Advantageous Effects of Invention

The present invention provides a valve device which incorporates an orifice and can be manufactured at low cost.

BRIEF DESCRIPTION OF DRAWINGS

FIG. 1A is a front view including a partial longitudinal section of a valve device according to an embodiment of the present invention.

FIG. 1B is a top view of the valve device in the FIG. 1A.

FIG. 1C is a bottom view of the valve device in FIG. 1A.

FIG. 1D is a side view of the valve device in FIG. 1A.

FIG. 2 is an enlarged cross-sectional view of a main part of the valve device of FIG. 1A, showing a valve-closed state.

FIG. 3 is an enlarged cross-sectional view of a main part of the valve device in FIG. 1A, showing the valve-open state.

FIG. 4 is a cross-sectional view of the inner disk.

FIG. 5 is a cross-sectional view of the valve seat.

FIG. 6 is a cross-sectional view of the valve seat support.

FIG. 7 is an enlarged cross-sectional view of a main part of a valve device according to a second embodiment of the present invention.

FIG. 8 is an enlarged cross-sectional view of a main part of a valve device according to a third embodiment of the present invention.

FIG. 9 is a schematic configuration diagram of a semiconductor manufacturing apparatus according to an embodiment of the present invention.

FIG. 10 is a perspective view showing an exemplary fluid control device to which the valve device of the present invention is applicable.

DESCRIPTION OF EMBODIMENTS

First Embodiment

Embodiments of the present invention will be described below with reference to the drawings. In the present specification and the drawings, the same reference numerals are used to denote components having substantially the same functions, and thus a repetitive description thereof is omitted.

FIGS. 1A to 1D show the structure of a valve device according to one embodiment of the present invention, FIGS. 2 and 3 show the operation of valve device of FIG. 1A, FIG. 4 shows the inner disc, FIG. 5 shows the valve seat and FIG. 6 shows the cross-sectional structure of the valve seat support.

In FIGS. 1A to 3, arrows A1 and A2 in the drawing are the vertical direction and A1 is the upward direction, and A2 is the downward direction. Arrows B1 and B2 are longitudinal directions of the valve body 20 of valve device 1, and B1 indicates one end side and B2 indicates the other end side. C1, C2 shows the width direction perpendicular to the longitudinal direction B1, B2 of the valve body 20, C1 indicates the front side, and C2 indicates the rear side.

The valve body 20 is a block-like member having a rectangular shape in top view defining the top surface 20f1 and the bottom surface 20f2, and four side surfaces 20f3 to 20f6 extending between the top surface 20f1 and the bottom surface 20f2. In addition, it defines an accommodation recess 22 which opens at the top surface 20f1. As can be seen from FIG. 2 and the like, the accommodation recess 22 is constituted by inner peripheral surfaces 22a, 22b and 22c having different diameters, and the bottom surface 22d. The diameters of the inner peripheral surfaces 22a, 22b and 22c decrease in this order. A valve element 2 is contained in the accommodation recess 22.

The valve body 20 defines a primary flow path 21 and a secondary flow path 24 connected to the accommodation recess 22. The primary flow path 21 is a flow path on which a fluid such as a gas is supplied from the outside, and secondary flow path 24 is a flow path for allowing the fluid such as a gas to flow out to the outside. Primary flow path 21 is open at the bottom surface 20f2 is formed to be inclined with respect to the bottom surface 20f2 of the valve body 20. Around the opening of the primary flow path 21, the seal holding portion 21a is formed. In the seal holding portion 21a, a gasket (not shown) is disposed as a seal member. The valve body 20 is connected to other flow path blocks (not shown) by fastening bolts screwed into screw holes 20h1. At this time, the gasket held in the seal holding portion 21a is crushed between the seal holding portion 21a and other flow path blocks (not shown) by the fastening force of the fastening bolts, and thereby the periphery of the opening of the primary flow path 21 is sealed.

Examples of the gasket include gaskets made of metal or resin. Examples of the gasket include a soft gasket, a semi-metal gasket, and a metal gasket. Specifically, the following is suitably used.

(1) Soft Gasket
Rubber O-ring
Rubber seat (for full seating)
Joint sheet
Expanded graphite sheet
PTFE sheets
PTFE jacketed type (2) Semi-Metal Gasket
Spiral gasket (Spiral-wound gasket)
Metal jacket gasket (3) Metal Gasket
Solid-metal flat gasket
Hollow metal O-ring
Ring joint The same applies to the seal-holding portions 25a1 and 26b1 provided around the openings of the branch flow path 25 and 26, which will be described later, and detailed descriptions thereof are omitted.

Secondary flow paths 24 includes two secondary flow paths 24A, 24B formed opposite to each other with respect to the accommodation recess 22 in the longitudinal direction B1, B2 of the valve body 20. Secondary flow paths 24A, 24B are formed on a common axis J1 extending in the longitudinal direction B1, B2 of the valve body 20. Secondary flow path 24A has one end open at the inner peripheral surface 22b of the accommodation recess 22, and the other end 24a1 closed inside the valve body 20. Secondary flow path 24B has one end is open at the inner peripheral surface 22b of the accommodation recess 22, and the other end 24b1 open at the side surface 20f6 side. To the opening of the side surface 20f6 of the secondary flow path 24B, a blocking member 30 is provided and fixed by means of welding etc. to close the opening of the secondary flow path 24B. Secondary flow paths 24A, 24B can be easily formed by using a tool such as a drill.

Secondary flow path 24A branches into two branch flow paths 25 at the other end 24a1, and they open at the top surface 20f1. Secondary flow path 24B branches into two branch flow paths 26 in the middle, and they open at the top surface 20f1.

That is, in valve device 1 according to the present embodiment, a flow of fluid such as a gas flowing into the primary flow path 21 can be divided into four by the branch flow paths 25, 26 of the secondary flow path 24.

The valve element 2 has a diaphragm 14, an inner disk 15, a valve seat 16, and a valve seat support 50. The valve element 2 blocks direct communication between the primary flow path 21 and the secondary flow path 24 through the accommodation recess 22 and makes the primary flow path 21 and the secondary flow path 24 communicate through the valve element 2. Hereinafter, the valve element 2 will be described in detail.

In the accommodation recess 22, the valve seat support 50 having an outer diameter to be fitted with the inner peripheral surface 22c is inserted. The valve seat support 50 is, as shown in FIG. 6, a cylindrical metal member in which a detour passage 50a being a through hole is formed in the central portion, and an annular support surface 50f1 is formed around detour passage 50a on the upper end surface. Support surface 50f1 of the valve seat support 50 is a flat surface, and on its outer peripheral portion, a step is formed. The outer peripheral surface 50b1 of the valve seat support 50 has a diameter to fit into the inner peripheral surface 22c of the accommodation recess 22, the outer peripheral surface 50b2 on the lower end side is reduced in diameter, and there is a step between them. An annular end surface 50b3 is formed by the step. As shown in FIG. 2 etc., a sealing member 51 made of a resin such as PTFE is fitted into the outer peripheral surface 50b2. Sealing member 51 formed in a rectangular cross-sectional shape, has a dimension to be crushed between the end surface 50b3 of the valve seat support 50 and the bottom surface 22d of the accommodation recess 22. When the sealing member 51 is crushed between the end surface 50b3 of the valve seat support 50 and the bottom surface 22d of the accommodation recess 22, the resin enters between the outer peripheral surface 50b1 of the valve seat support 50 and the inner peripheral surface 22c and the bottom surface 22d of the accommodation recess 22, to reliably seal a gap between the valve seat support 50 and the accommodation recess 22. That is, the outer peripheral surface 50b2 and the end surface 50b3 as the sealing portions cooperate with the inner peripheral surface 22c and the bottom surface 22d of the accommodation recess 22 to block the communication between the primary flow path 21 and the secondary flow path 24.

Detour passage 50a of the valve seat support 50 is connected to the primary flow path 21 which opens at the bottom surface 22d of the accommodation recess 22.

On the support surface 50f1 of the valve seat support 50, the valve seat 16 is provided.

As shown in FIG. 5, the valve seat 16 is formed in an annular shape of a resin such as PFA or PTFE so as to be elastically deformable, and has an annular seating surface 16s formed on one end surface and an annular sealing surface 16f formed on the other end surface of the valve seat 16. Inside the seating surface 16s and the sealing surface 16f, a flow passage 16p being a through hole is formed.

The flow passage 16p is connected to the detour passage 50a of the valve seat support 50, and is also an orifice having an inner diameter sufficiently smaller than the inner diameter of detour passage 50a (hereinafter, the flow passage 16p is also referred to as orifice 16p). The flow passage 16p and the detour passage 50a of the valve seat support 50 constitute the through flow passage.

Valve seat 16 has a small-diameter portion 16b1 and the large-diameter portion 16b2 on its outer peripheral side, a stepped portion is formed between the small-diameter portion 16b1 and the large-diameter portion 16b2.

Valve seat 16 is positioned with respect to the support surface 50f1 of the valve seat support 50, and is pressed toward the support surface 50f1 of the valve seat support 50 by the inner disk 15 as a positioning pressing member. Specifically, a large diameter portion 15a1 and the small diameter portion 15a2 are formed in the center of the inner disk 15, and the stepped surface 15a3 is formed between the large diameter portion 15a1 and the small diameter portion 15a2. On one end surface side of the inner disk 15, an annular flat surface 15f1 is formed. On the other end surface side of the inner disk 15, an annular flat surface 15f2 is formed on the outside, and an annular flat surface 15f3 is formed on the inside. The height is different from the flat surface 15f2 and the flat surface 15f3, and the flat surface 15f3 is located near the flat surface 15f1. On the outer peripheral side of the inner disk 15, an outer peripheral surface 15b to be fitted to the inner peripheral surface 22a of the accommodation recess 22 is formed. Furthermore, a plurality of flow passages 15h penetrating from one end surface to the other end surface is formed at equal intervals in the circumferential direction. The large-diameter portion 16b2 and the small-diameter portion 16b1 of the valve seat 16 are fitted to the large-diameter portion 15a1 and the small-diameter portion 15a2 of the inner disk 15, and thereby the valve seat 16 is positioned with respect to the support surface 50f1 of the valve seat support 50.

The flat surface 15f2 of the inner disk 15 is installed on a flat stepped surface formed between the inner peripheral surface 22a and the inner peripheral surface 22b of the accommodation recess 22. On the flat surface 15f1 of the inner disk 15, a diaphragm 14 is installed, and on the diaphragm 14, a pressing ring 13 is installed.

The actuator 10 is driven by a driving source such as a pneumatic pressure, and moves the diaphragm presser 12 movably held in the vertical directions A1 and A2. The fore-end portion of the casing 11 of the actuator 10, as shown in FIG. 1A, is screwed into and fixed to the valve body 20. Then, the fore-end portion presses the pressing ring 13 downward A2, and thereby the diaphragm 14 is fixed in the accommodation recess 22. The diaphragm 14 seals the accommodation recess 22 at the opening side. In addition, the inner disk 15 is also pressed in downward direction A2. The height of the stepped surface 15a3 is set so that the stepped surface 15a3 presses the valve seat 16 toward the support surface 50f1 of the valve seat support 50, when the flat surface 15f2 of the inner disk 15 is pressed against the stepped surface of the accommodation recess 22. Further, the flat surface 15f3 of the inner disk 15 is adapted not to abut on the upper end surface of the valve seat support 50.

The diaphragm 14 has a larger diameter than the valve seat 16, and is made of a metal such as stainless steel or NiCo alloys or a fluorine-based resin in a spherical shell shape so as to be elastically deformable. The diaphragm 14 is supported on the valve body 20 so as to be able to abut to and separate from the seating surface 16s of the valve seat 16.

In FIG. 2, the diaphragm 14 is elastically deformed by being pressed by the diaphragm presser 12, and is in a state of being pressed against the seating surface 16s of the valve seat 16. Diaphragm 14 restores the spherical shell shape as shown in FIG. 3 when the pressing force by the diaphragm presser 12 is released. When the diaphragm 14 is pressed against the seating surface 16s of the valve seat 16, the flow path between the primary flow path 21 and the secondary flow path 24 is in a closed state. When the diaphragm presser 12 is moved in the upward direction A1, as shown in FIG. 3, the diaphragm 14 is moved away from the seating surface 16s of the valve seat 16. Then, the fluid supplied from the primary flow path 21 passes through the orifice 16p of the valve seat 16, through the gap between the diaphragm 14 and the seating surface 16s of the valve seat 16, through the secondary flow path 24A, and flows into 24B. Eventually, the fluid supplied from the primary flow path 21 flows out of the valve body 20 through the branch flow paths 25 and 26.

As described above, according to the present embodiment, the orifice function can be easily added to valve device 1 by forming the orifice 16p in the valve seat 16, which is a component of the valve element 2, without directly forming the orifice in the valve body 20. Further, since there is no need to enlarge the valve body 20 for the orifice 16p, it is also possible to maintain the miniaturization of the valve body 20.

In the above embodiment, the secondary flow path 24 branches into a plurality of branches in the valve body 20, and the branch flow paths 25 and 26 open at the top surface 20f1 of the valve body 20, but the present invention is not limited to this, and the present invention may employ a configuration in which the secondary flow path 24 opens at either the bottom surface 20f2 or the side surfaces 20f3 to 20f6.

In the above embodiment, the inner disk 15 and the valve seat 16 are separate members, but it is also possible to integrate the inner disk 15 and the valve seat 16.

Second Embodiment

FIG. 7 shows a valve device according to the second embodiment of the present invention. In FIG. 7, the same reference numerals are used for the same components as in the above embodiment.

Valve seat support 50B of valve device shown in FIG. 7 has a cylindrical projecting portion 50t at the center of the upper end, and in the center of the projecting portion 50t, an orifice 50p having an inner diameter sufficiently smaller than the inner diameter of detour passage 50a is formed. In a valve seat 16B, a through hole 16a is formed in the central portion, and the projecting portion 50t of the valve seat support 50B is fitted and inserted thereto.

According to the present embodiment, the orifice function can be easily added to the valve device by forming the orifice 50p in the valve seat support 50B, which is a component of the valve element 2, without directly forming the orifice in the valve body 20.

Third Embodiment

FIG. 8 shows a valve device according to a third embodiment of the present invention. In FIG. 8, the same reference numerals are used for the same components as in the above embodiment.

The valve device according to the present embodiment includes two valve elements 2A,2B to a common valve body 20

Valve body 20 defines two accommodation recesses 22A, 22B which open at the top surface 20f1. The accommodation recesses 22A and 22B have the same structure as that of the above accommodation recess 22, and are spaced apart from each other in the longitudinal directions B1 and B2. The accommodation recesses 22A and 22B contain valve elements 2A and 2B, respectively. The valve body 20 defines primary flow paths 21A and 21B connected to the first and second accommodation recesses 22A and 22B, respectively, secondary flow paths 24A and 24B connected to the accommodation recess 22A and 22B, respectively, and a communication flow path 24C for connecting the accommodation recesses 22A and 22B. The communication flow path 24C functions as a part of the secondary flow path 24.

Primary flow path 21A is formed to be inclined with respect to the bottom surface 20f2 of the valve body 20, one end is connected to the bottom surface 22d of the accommodation recess 22A, and the other end is open at the bottom surface 20f2.

Primary flow path 21B is formed to be inclined in the opposite direction to the primary flow path 21A with respect to the bottom surface 20f2 of the valve body 20, one end is connected by the bottom surface 22d of the accommodation recess 22B, the other end is open at the bottom surface 20f2.

Seal holding portions 21a and 21b similar to the seal holding portion 21a described above are formed around the openings of the primary flow path 21A and 21B, respectively.

Secondary flow path 24 includes two secondary flow paths 24A and 24B formed on opposite sides with respect to the accommodation recesses 22A, 22B in the longitudinal direction B1, B2 of the valve body 20, and a communication flow path 24C connecting the accommodation recesses 22A and 22B.

The secondary flow path 24A, 24B and the communication flow path 24C are formed on a common axis J1 extending in the longitudinal direction B1, B2 of the valve body 20.

Secondary flow path 24A has one end opening at the inner peripheral surface 22b of the accommodation recess 22A, and the other end 24a1 closed inside the valve body 20.

Secondary flow path 24B has one end opening at the inner peripheral surface 22b of the accommodation recess 22B, and the other end 24b1 open at the side surface 20f6 side.

To the opening at the side surface 20f6 of the secondary flow path 24B, the blocking member 30 is provided and fixed by means of welding etc. to close the opening of the secondary flow path 24B.

Communication flow path 24C has one end open at the inner peripheral surface 22b of the accommodation recess 22A, and the other end open at the inner peripheral surface 22b of the accommodation recess 22B. The secondary flow path 24A and the secondary flow path 24B communicate with each other via a communication flow path 24C.

The secondary flow paths 24A, 24B and communication flow path 24C, which constitute the secondary flow path 24, can be easily formed by using tools such as drills. Incidentally, the secondary flow path 24 may be formed by machining using a drill etc. from the other end of the valve body 20, or may be formed by machining using a drill etc. from both one end and the other end to form respective holes and connecting them in the valve body 20.

Secondary flow path 24A branches into two branch flow paths 25 at the other end 24a1, and they open at the top surface 20f1.

Secondary flow path 24B branches into two branch flow paths 26 in the middle, and they open at the top surface 20f1.

The valve element 2A has the same construction as the valve element 2 of the first embodiment. The valve element 2A is provided with an orifice 16p. The valve element 2B is not provided with an orifice.

Thus, two valve elements 2A and 2B can be provided on the common valve body 20, and an orifice can be provided only to one valve element 2A. The fluid supplied from the primary flow path 21A or 21B commonly flows out to the secondary flow paths 24A, 24B and 24C. Among the valve element 2A and the valve element 2B, one is selectively opened and the other is closed.

Although the orifice 16p is formed in the valve seat 16 of the valve element 2A in the present embodiment, the present invention is not limited thereto, and the orifice can be formed in the valve seat support similarly to the second embodiment.

Next, referring to FIG. 9, an application of the above-described valve device 1 will be described.

Semiconductor manufacturing apparatus 1000 shown in FIG. 9 is a system for performing a semiconductor manufacturing process by atomic layer deposition (ALD: Atomic Layer Deposition), where 600 denotes a process gas source, 700 denotes a gas box, 710 denotes a tank, 720 denotes a valve, 800 denotes a processing chamber, and 900 denotes an exhaust pump.

In a treatment process for depositing a film on a substrate, in order to stably supply a process gas, a process gas supplied from a gas box 700 is temporarily stored in a tank 710 as a buffer, and a valve 720 provided in the immediate vicinity of the processing chamber 800 is opened and closed at high frequency to supply the process gas from the tank to the processing chamber 800 in a vacuum atmosphere.

The ALD method is one of chemical vapor deposition methods, in which two or more types of process gases are alternately flowed on the substrate surface under film forming conditions such as temperature and time to react with atoms on the substrate surface to deposit a film layer by layer, and since the monoatomic layer can be controlled, a uniform film thickness can be formed and a film can be grown very densely in terms of film quality.

In the semiconductor manufacturing process by the ALD method, it is necessary to precisely adjust the flow rate of the process gas, and to cope with the increase of the diameter of the substrate or the like, it is also necessary to ensure a certain amount of flow rate of the process gas.

The gas box 700 houses an integrated fluid control device of various fluid devices in a box to provide a precisely metered process gas to the processing chamber 800. Fluid control devices include the valve device according to the embodiments described above.

The tank 710 functions as a buffer for temporarily storing the process gas supplied from the gas box 700.

The processing chamber 800 provides a sealed processing space for depositing a film on a substrate by an ALD method.

Exhaust pump 900 draws a vacuum in the processing chamber 800.

Referring to FIG. 10, an exemplary fluid control device to which the inventive valve device is applicable will be described.

In the fluid control device shown in FIG. 10, a metallic base plate BS extending in the longitudinal direction G1, G2 and arranged along the width direction W1, W2 is provided. Note that W1 represents the front side, W2 represents the back side, G1 represents the upstream side, and G2 represents the downstream side. Various fluid devices 991A to 991E are installed on the base plate BS via a plurality of flow path blocks 992, and a flow path (not shown) through which fluid flows from the upstream side G1 to the downstream side G2 is formed by the plurality of flow path blocks 992.

Here, a "fluid device" is a device used in a fluid control device for controlling the flow of a fluid, the device comprising a body defining a fluid flow path and having at least two flow path ports opening at the surfaces of the body. Specifically, the fluid devices include open-close valves (2-way valves) 991A, regulators 991B, pressure gauges 991C, open-close valves (3-way valves) 991D, mass flow controllers 991E and the like, but not limited thereto. The inlet tube 993 is connected to an upstream flow path port of flow path (not shown).

The present invention can be applied to various valve devices such as the above-described open-close valves 991A and 991D and the regulator 991B.

REFERENCE SIGNS LIST

1: Valve device
2, 2A,2B: Valve element
10: Actuator
11: Casing
12: Diaphragm presser
13: Pressing ring
14: Diaphragm
15: Inner disk
15h: Flow passage
16,16B: Valve seat
16a: Through hole
16f: Sealing surface
16p: Orifice (flow passage)
16s: Seating surface
20: Valve body
20f1: Top surface
20f2: Bottom surface
20f3-20f6: Side surface
20h1: Screw hole
21: Primary flow path
21a: Seal holding portion
22: Accommodation recess
22b: Inner peripheral surface
24A, 24B, 24: Secondary flow path
25,26: Branch flow path
30: Blocking member
50,50B: Valve seat support
50a: Detour passage
50p: Orifice
50t: Projecting portion
50f1: Support surface
50b2: Outer peripheral surface (sealing surface, sealing portion)
50b3: End surface (sealing surface, sealing portion)
51: Sealing member
600: Process gas source
700: Gas box
710: Tank
720: Valve
800: Processing chamber
900: Exhaust pump
1000: Semiconductor manufacturing apparatus
A1: Upward
A2: Downward
991A: Open/close valve
991B: Regulator
991C: Pressure gauge
991D: Open-close valve
991E: Mass flow controller
992: Flow path blocks
993: Inlet tube
BS: Base plate
G1: Longitudinal direction (upstream)
G2: Longitudinal direction (downstream)
W1: Width direction
W2: Width direction

The invention claimed is:

1. A valve device comprising:
a block-shaped valve body, and
a seal member,
the valve body defining an accommodation recess opening at a surface of the valve body and containing a valve element, a primary flow path connected to a bottom surface of the accommodation recess, and a secondary flow path connected to an inner peripheral surface of the accommodation recess,
the valve element having a through flow passage that makes the primary flow path and the secondary flow path communicate through the valve element,
wherein an orifice is formed as a part of the through flow passage, the seal member being made of a resin, formed in an annular shape with a rectangular cross-section, and fitted and crushed in a gap between the accommodation recess and the valve element, so that an outer peripheral surface and a lower surface of the seal member surface-contact with the inner peripheral surface and the bottom surface, respectively, of the accommodation recess, and an inner peripheral surface and an upper surface of the seal member surface-contact with an outer peripheral surface of a small-diameter portion and a stepped surface, respectively, of the valve element, to block a direct communication between the primary flow path and the secondary flow path through the accommodation recess.

2. The valve device according to claim 1, wherein the valve element comprises:
a valve seat having an annular seating surface formed on one end surface, and an annular sealing surface formed on the other end surface, and a flow passage formed on an inner side of the seating surface and the sealing surface and penetrating from said one end surface to the other end surface;
a valve seat support having a support surface to contact the sealing surface of the valve seat and support a pressing force from the sealing surface; and
a diaphragm provided so as to abut to and separate from the seating surface supported by the valve seat support;
the diaphragm making the flow passage and the secondary flow path communicate through a gap between the diaphragm and the seating surface,
the valve seat support having the stepped surface and the small-diameter portion in a lower end portion with which the seal member surface-contacts, and a detour passage to connect the primary flow path and the flow passage,
wherein the orifice is formed as a part of in the flow passage of the valve seat.

3. A valve device comprising:
a block-shaped valve body, and
seal members,
the valve body defining first and second accommodation recesses respectively containing first and second valve elements, a primary flow path that makes each of the first and second accommodation recesses communicate to an outside of the valve body, a secondary flow path that makes each of the first and second accommodation recesses communicate to the outside of the valve body, and a communication flow path that connects the first and second accommodation recesses to make the secondary flow paths communicate with each other,
each of the first and second valve elements having a through flow passage that makes the primary flow path and the secondary flow path communicate through a respective one of the valve elements,
wherein an orifice is formed as a part of in the through flow passage of one of the first and second valve elements,
the seal members each being made of a resin, formed in an annular shape with a rectangular cross-section, and fitted and crushed in a gap between a respective one of the accommodation recesses and a respective one of the valve elements, so that an outer peripheral surface and a lower surface of each of the seal members surface-contacts with an inner peripheral surface and a bottom surface, respectively, of the respective one of the accommodation recesses, and an inner peripheral surface and an upper surface of each of the seal members surface-contacts with an outer peripheral surface of a small-diameter portion and a stepped surface, respectively, of the respective one of the valve elements, to block a direct communication between the primary flow path and the secondary flow path through the respective one of the accommodation recesses.

4. A fluid control device comprising a plurality of fluid devices that is arranged, the plurality of fluid devices including the valve device as claimed in claim 1.

5. The valve device according to claim 3, wherein each of the first and the second valve elements comprises:
a valve seat having an annular seating surface formed on one end surface, and an annular sealing surface formed on the other end surface, and a flow passage formed on an inner side of the seating surface and the sealing surface and penetrating from said one end surface to the other end surface;
a valve seat support having a support surface to contact the sealing surface of the valve seat and support a pressing force from the sealing surface; and
a diaphragm provided so as to abut to and separate from the seating surface supported by the valve seat support;
the diaphragm making the flow passage and the secondary flow path communicate through a gap between the diaphragm and the seating surface,
the valve seat support having the stepped surface and the small-diameter portion in a lower end portion with which a respective one of the seal members surface-contacts, and a detour passage to connect the primary flow path and the flow passage,
wherein the orifice is formed as a part of the flow passage of the valve seat.

* * * * *